(12) United States Patent
Besshi et al.

(10) Patent No.: US 9,236,324 B2
(45) Date of Patent: Jan. 12, 2016

(54) ELECTRIC POWER SEMICONDUCTOR DEVICE AND METHOD FOR PRODUCING SAME

(71) Applicants: Noriyuki Besshi, Chiyoda-ku (JP); Dai Nakajima, Chiyoda-ku (JP)

(72) Inventors: Noriyuki Besshi, Chiyoda-ku (JP); Dai Nakajima, Chiyoda-ku (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 105 days.

(21) Appl. No.: 14/358,140

(22) PCT Filed: Dec. 5, 2012

(86) PCT No.: PCT/JP2012/081549
§ 371 (c)(1),
(2) Date: May 14, 2014

(87) PCT Pub. No.: WO2013/099545
PCT Pub. Date: Jul. 4, 2013

(65) Prior Publication Data
US 2014/0293548 A1  Oct. 2, 2014

(30) Foreign Application Priority Data

Dec. 26, 2011  (JP) .................................. 2011-283800

(51) Int. Cl.
*H05K 7/20* (2006.01)
*H01L 23/373* (2006.01)
(Continued)

(52) U.S. Cl.
CPC ........ *H01L 23/3736* (2013.01); *H01L 23/3107* (2013.01); *H01L 23/3737* (2013.01);
(Continued)

(58) Field of Classification Search
CPC ........... G06F 1/181–1/182; G06F 1/16; G06F 1/1601–1/1611; G06F 1/1613–1/1698; G06F 1/18–1/189; H05K 7/20218–7/20381; H05K 7/20409–7/20418; H05K 7/20009–7/202; H05K 5/00–5/069; H05K 7/00–7/186; H01L 23/367–23/3677; H01L 23/473; H01L 23/46–23/467
USPC ....................... 361/676–678, 679.46–679.54, 361/688–723, 699–704, 709–710, 361/719–721; 165/699–704, 709–710, 165/719–721; 174/15.1–15.3, 16.1–16.3, 174/547, 548; 257/712–722, E23.088; 454/184; 312/236; 24/453, 458–459; 348/787, 789, 794; 349/56–60
See application file for complete search history.

(56) References Cited

U.S. PATENT DOCUMENTS 6,154,369 A * 11/2000 Martinez, Jr. ........... H01L 23/24
                                                         174/252

(Continued)

FOREIGN PATENT DOCUMENTS

JP          2004-146574 A       5/2004
(Continued)

OTHER PUBLICATIONS

Notification of Transmittal of Translation of the International Preliminary Report on Patentability (Forms PCT/IB/338 and PCT/IB/373) and the Written Opinion of the International Searching Authority (Form PCT/ISA/237) issued on Jul. 10, 2014, by the International Bureau of WIPO in corresponding International Application No. PCT/JP2012/081549. (10 pages).

(Continued)

*Primary Examiner* — Anthony Haughton
*Assistant Examiner* — Razmeen Gafur
(74) *Attorney, Agent, or Firm* — Buchanan Ingersoll & Rooney PC

(57) ABSTRACT

An electric power semiconductor device includes a power module and a heat dissipating member connected to the power module through a heat-conductive insulating resin sheet in which a mold resin part included in the power module has a protruding part in its peripheral part to prevent the heat-conductive insulating resin sheet from expanding in a planar direction. The heat-conductive insulating resin sheet is slightly thicker than the protruding part and has a resin exuding part exuded from a small gap between the protruding part and the heat dissipating member while the power module and the heat dissipating member are heated and pressurized to be bonded.

5 Claims, 10 Drawing Sheets

(51) Int. Cl.
*H01L 23/31* (2006.01)
*H01L 23/433* (2006.01)
*H01L 23/473* (2006.01)
*H01L 23/00* (2006.01)

(52) U.S. Cl.
CPC ............ *H01L23/4334* (2013.01); *H01L 24/29* (2013.01); *H01L 24/83* (2013.01); *H01L 24/06* (2013.01); *H01L 24/32* (2013.01); *H01L 24/33* (2013.01); *H01L 2224/04026* (2013.01); *H01L 2224/06181* (2013.01); *H01L 2224/32245* (2013.01); *H01L 2224/33181* (2013.01); *H01L 2924/13055* (2013.01); *H01L 2924/181* (2013.01); *H01L 2924/1815* (2013.01); *H01L 2924/351* (2013.01)

(56) References Cited

U.S. PATENT DOCUMENTS

| | | | | |
|---|---|---|---|---|
| 2003/0090915 | A1 | 5/2003 | Nakamura et al. | |
| 2003/0198022 | A1* | 10/2003 | Ye | H01L 23/36 361/719 |
| 2004/0089928 | A1 | 5/2004 | Nakajima et al. | |
| 2006/0091512 | A1 | 5/2006 | Shinohara | |
| 2009/0010002 | A1* | 1/2009 | Chen | G06F 1/181 362/282 |
| 2010/0078807 | A1* | 4/2010 | Schulz | H01L 23/34 257/713 |
| 2010/0101878 | A1* | 4/2010 | Yoshida | H01L 23/34 180/65.31 |
| 2010/0109016 | A1* | 5/2010 | Yagi | H01L 23/473 257/76 |
| 2010/0156585 | A1* | 6/2010 | Solar | H01F 27/10 336/105 |
| 2010/0254089 | A1* | 10/2010 | Anderl | H01L 23/4093 361/702 |
| 2010/0302733 | A1* | 12/2010 | Woody | H01L 23/473 361/699 |
| 2010/0314070 | A1* | 12/2010 | Yang | F24J 3/083 165/45 |
| 2011/0049535 | A1* | 3/2011 | Soeno | H01L 24/34 257/77 |
| 2011/0049976 | A1* | 3/2011 | Suzuki | H05K 7/203 307/9.1 |
| 2011/0122583 | A1* | 5/2011 | Lowry | H01L 23/433 361/699 |
| 2011/0134608 | A1* | 6/2011 | Nakajima | H01L 23/3735 361/709 |
| 2011/0147917 | A1* | 6/2011 | England | H01L 23/49827 257/692 |
| 2011/0235276 | A1* | 9/2011 | Hentschel | H01L 23/473 361/699 |
| 2011/0241198 | A1* | 10/2011 | Azuma | H01L 23/051 257/696 |
| 2011/0242760 | A1* | 10/2011 | Bott | H01L 23/473 361/699 |
| 2011/0249402 | A1* | 10/2011 | Hentschel | H01L 23/473 361/699 |
| 2011/0292611 | A1* | 12/2011 | Higuchi | H01L 23/3675 361/717 |
| 2011/0310585 | A1* | 12/2011 | Suwa | H01L 24/73 361/820 |
| 2012/0001341 | A1* | 1/2012 | Ide | H01L 23/473 257/773 |
| 2012/0008282 | A1* | 1/2012 | Ide | H01L 23/4334 361/702 |
| 2012/0091573 | A1* | 4/2012 | Sasaki | H01L 23/3107 257/717 |
| 2012/0319253 | A1* | 12/2012 | Mizuno | B23K 1/0012 257/659 |

FOREIGN PATENT DOCUMENTS

| | | |
|---|---|---|
| JP | 2004-165281 A | 6/2004 |
| JP | 3641232 B2 | 4/2005 |
| JP | 2006-128555 A | 5/2006 |
| JP | 2008-066374 A | 3/2008 |
| JP | 2010-114257 A | 5/2010 |
| JP | 2011-238643 A | 11/2011 |

OTHER PUBLICATIONS

International Search Report (PCT/ISA/210) mailed on Mar. 12, 2013, by the Japanese Patent Office as the International Searching Authority for International Application No. PCT/JP2012/081549.

\* cited by examiner

Fig. 7
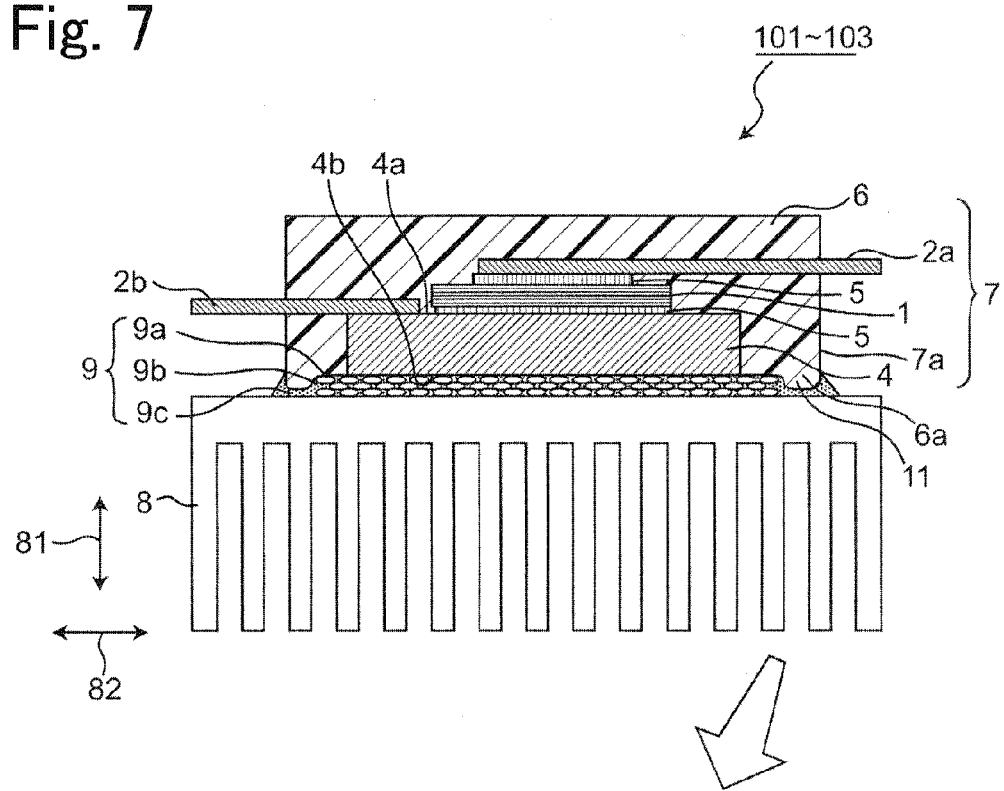
ENLARGED VIEW
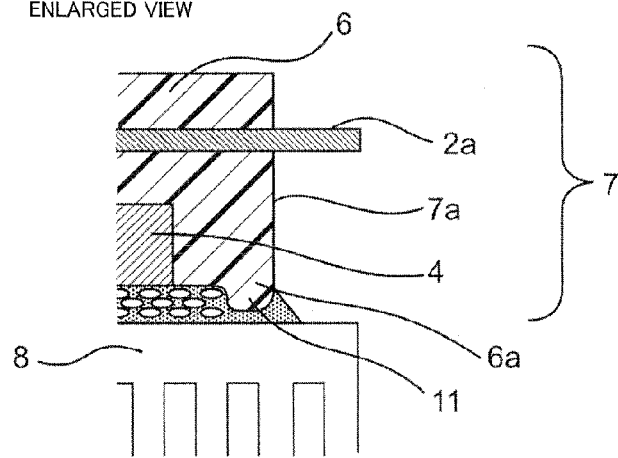

Fig. 8
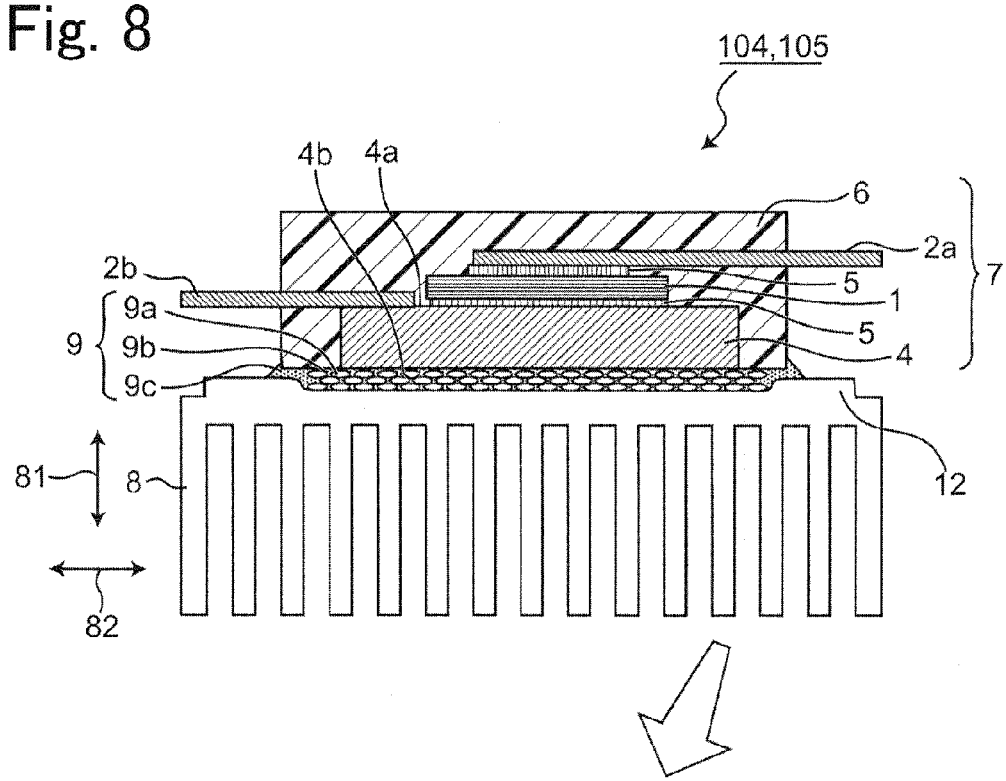
ENLARGED VIEW
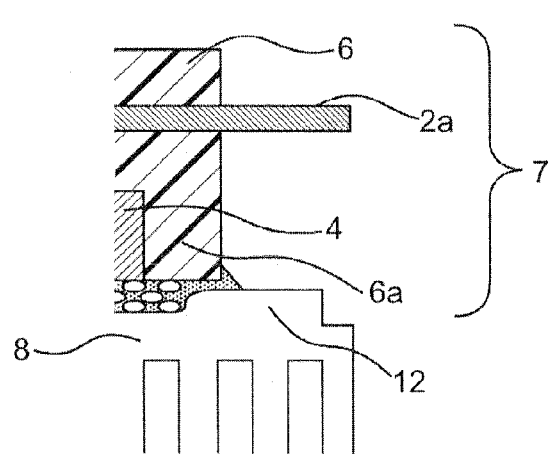

Fig. 11
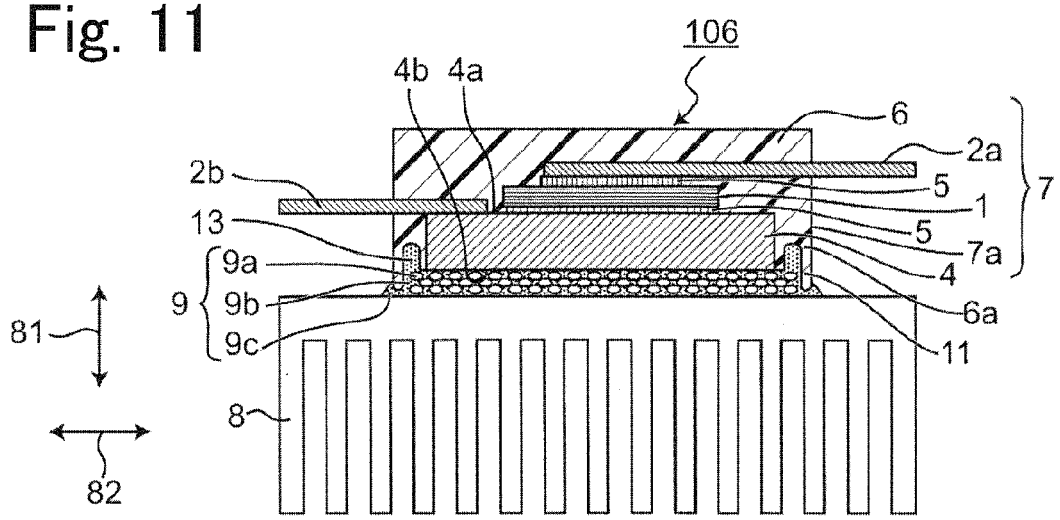
ENLARGED VIEW
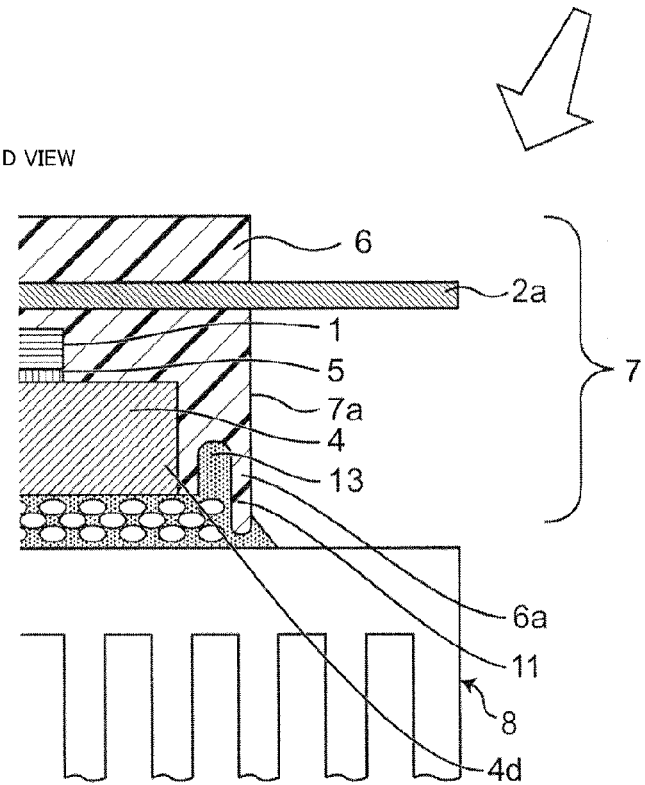

Fig. 12
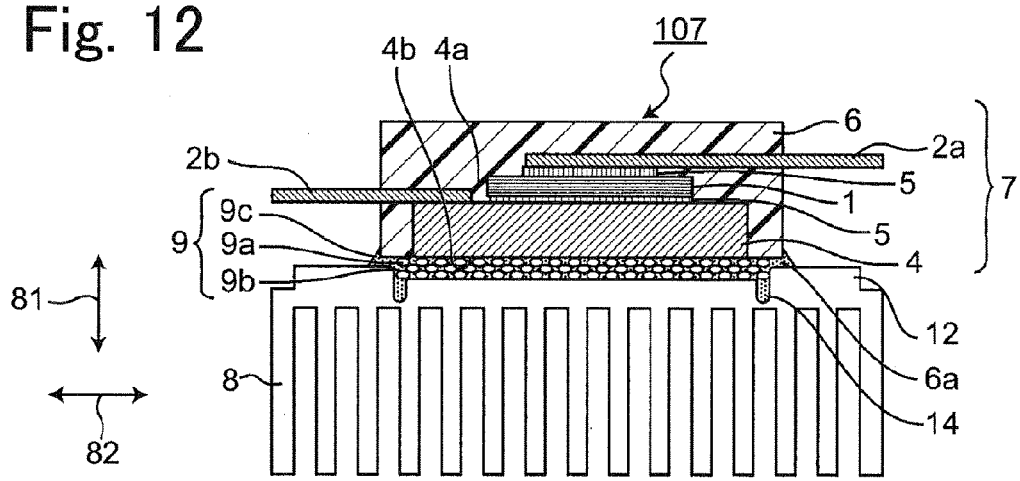
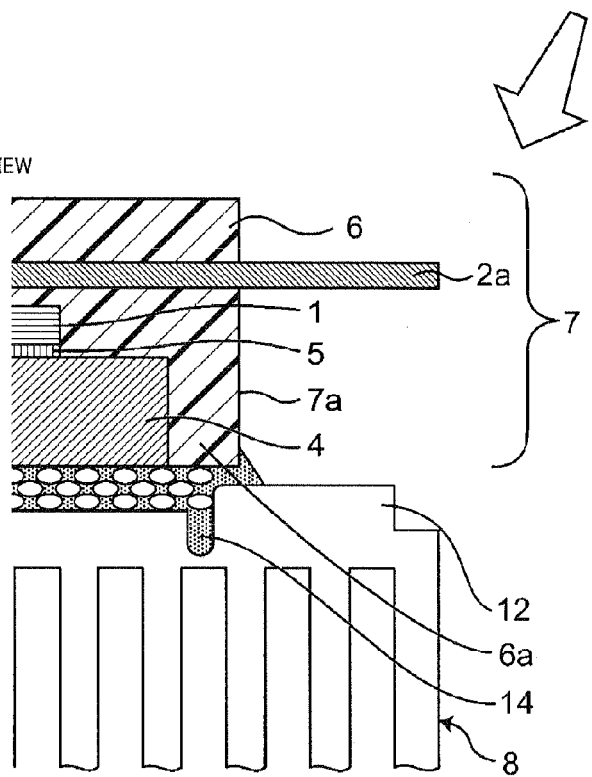
ENLARGED VIEW

Fig. 13
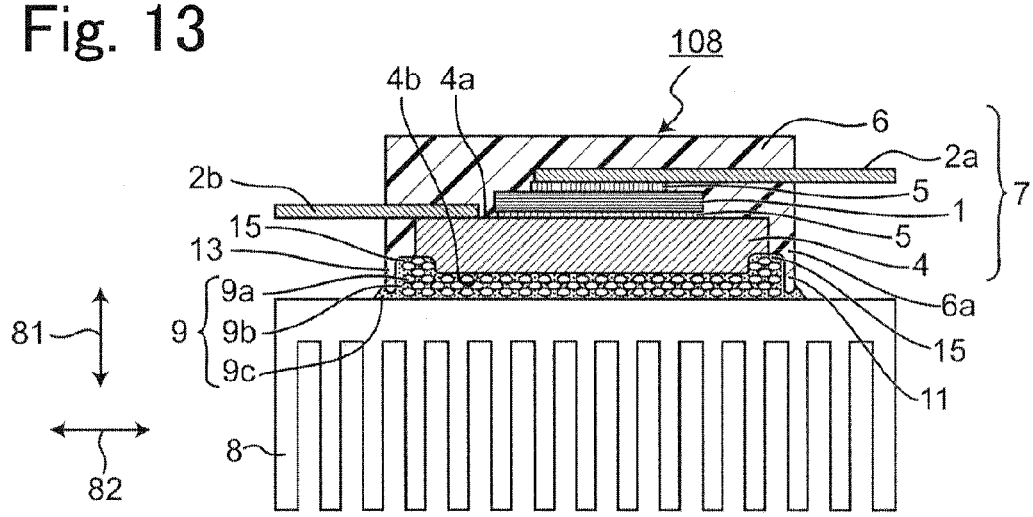
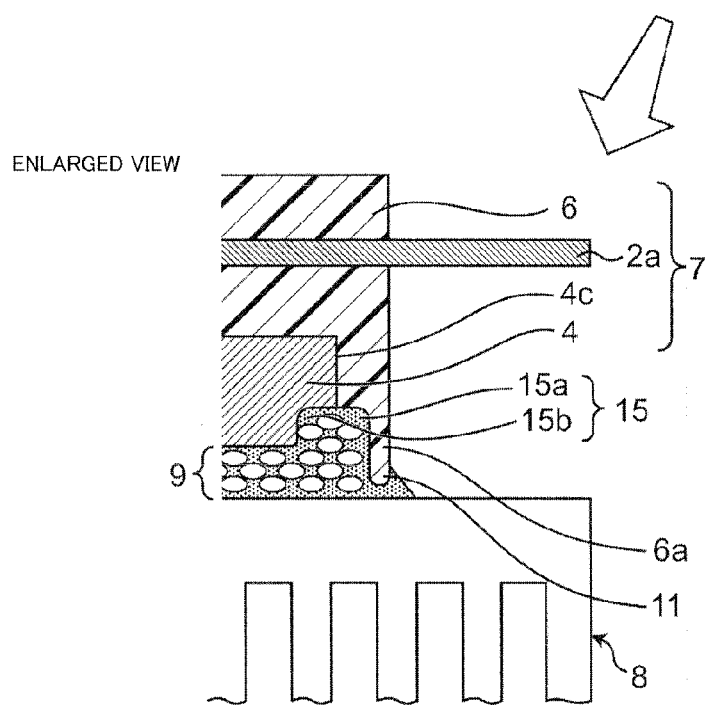
ENLARGED VIEW

ELECTRIC POWER SEMICONDUCTOR DEVICE AND METHOD FOR PRODUCING SAME

TECHNICAL FIELD

The present invention relates to an electric power semiconductor device formed in such a manner that a semiconductor module with a semiconductor element sealed and a heat dissipating member are connected through a heat-conductive resin layer, and a method for producing same.

BACKGROUND ART

A heat-conductive resin is interposed in a connecting part between a heat generating part and a heat dissipating member in an electric device or an electronic device in many cases to preferably transfer heat from the heat generating part to the heat dissipating member. The heat-conductive resin is required to have high heat conductivity, insulating properties, and adhesive properties, so that a heat-conductive resin composition in which an inorganic filler is added to a thermosetting resin is used.

As for a power module having a power semiconductor element generating a large amount of heat, a heat-conductive resin layer is provided in a connection part between it and a heat sink serving as the heat dissipating member, in an electric power semiconductor device. As this heat-conductive resin layer, a thermosetting resin or a coated film containing the inorganic filler is used. The heat-conductive resin layer bonds the power module and the heat sink while a metal wiring member mounting the power semiconductor element is partially heated and pressurized only to the extent that the power semiconductor element is not damaged (Patent Document 1).

PRIOR ART DOCUMENTS

Patent Document

Patent Document 1: JP 3641232 B1

SUMMARY OF THE INVENTION

Problems to be Solved by the Invention

However, the electric power semiconductor device having the above heat-conductive resin layer has problems in electric insulating properties and reliability of the electric power semiconductor device. Especially, as for a semiconductor device having a wide gap semiconductor such as SiC used at high temperature, the above problems could become more conspicuous.

The problem in electric insulating properties arises between the metal wiring member mounting the power semiconductor element, and the heat sink. That is, in order to electrically insulate the metal wiring member from the heat sink, the heat-conductive resin layer in the electric power semiconductor device is required to have high withstand voltage characteristics, but voids contained in the heat-conductive resin layer deteriorate the withstand voltage characteristics. That is, as shown in the Paschen's law, there is a correlative relationship between a void size in the insulating layer and a discharge voltage, so that to reduce the void size leads to increase in voltage to generate the discharge. Therefore, it is good to undergo a process of crushing the void, and it is good to apply a pressure when the heat-conductive resin layer is in a softened state before it is cured. More specifically, JP 2004-165281 A, for example discloses that in a process of manufacturing a transfer mold type power module, when an uncured heat-conductive resin layer is heated and cured, a high injection pressure of 10 MPa is applied to crush the voids in the heat-conductive resin layer to improve the withstand voltage characteristics.

However, according to this method, in a process of bonding the metal wiring member mounting the power semiconductor element and the heat sink with the heat-conductive resin layer, the pressure cannot be sufficiently applied to an outer circumference part of the heat-conductive resin layer which is not in contact with the metal wiring member, so that the voids cannot be adequately crushed there. Therefore, the problem that the electric insulating properties between the metal wiring member and the heat sink deteriorate occurs. In order to eliminate this problem, the voids need to be crushed in whole area of the heat-conductive resin layer.

Next, the problem in reliability of the electric power semiconductor device will be described.

A material of the heat sink is, for example, aluminum in view of heat conduction, while the metal wiring member is made of copper in view of electrical conductivity. Therefore, thermal stress is applied to the heat-conductive resin layer sandwiched between the heat sink and the metal wiring member, due to a difference in linear expansion coefficient between both members, in response to a temperature change from −40° C. to 125° C., for example. At this time, a region receiving the greatest thermal stress is a region between the heat-conductive resin layer and a corner part of the metal wiring member, or a region between the heat-conductive resin layer and a corner part of the heat sink, and stress in a shear direction is applied to this region. In each of the above corner parts, respective members are simply laminated as its configuration, so that a notch exists in the corner part in parallel to the shear direction in a microscopic viewpoint, and this becomes a starting point of peeling. In a case where the peeling proceeds from the corner part of the heat-conductive resin layer or the region between the heat-conductive resin layer and the corner part of the heat sink, the electric insulating properties between the metal wiring member and the heat sink are reduced, and the heat dissipating properties are reduced, so that it is necessary to prevent the peeling starting point from being formed in parallel to the shear direction.

The present invention is made in order to solve the above problems, and an object of the present invention is to provide an electric power semiconductor device having preferable electric insulating properties and reliability compared with the conventional one, and a method for producing same.

Means for Solving the Problems

In order to attain the above object, the present invention is configured as follows.

Namely, an electric power semiconductor device in the one aspect of the present invention is characterized by comprising a power module and a heat dissipating member connected to the power module, wherein, the power module has a metal wiring member mounting a power semiconductor element on a mounting face, and a molded resin part sealing the power semiconductor element and the metal wiring member in a state that an opposed face opposite to the mounting face is exposed in the metal wiring member; and the heat dissipating member is arranged on the opposed face with a heat-conductive insulating resin sheet provided therebetween, in which, one of the molded resin part and the heat dissipating member has a protruding part configured to have a height slightly smaller than a thickness of the heat-conductive insulating resin sheet in a thickness direction of the electric power semiconductor device, the protruding part in the molded resin part is formed in a peripheral part of the molded resin part, and the protruding part in the heat dissipating member is formed to be opposed to the peripheral part of the molded resin part; and the heat-conductive insulating resin sheet has a resin exuding part configured to extend beyond the peripheral part of the molded resin part to an outside of the molded resin part in a direction perpendicular to the thickness direction.

Effects of the Invention

According to the electric power semiconductor device in the one aspect of the present invention, since the protruding part is formed on the molded resin part or the heat dissipating member, the heat-conductive insulating resin sheet provided between the molded resin part and the heat dissipating member is prevented from spreading in its planar direction. Meanwhile, the heat-conductive insulating resin sheet has the resin exuding part at the gap between the molded resin part and the heat dissipating member in the protruding part. Thus, voids in the heat-conductive insulating resin sheet are effectively crushed in a state that the resin exuding part is created due to applying the pressure, so that preferable electric insulating properties between the metal wiring member and the heat dissipating member can be ensured. Furthermore, the heat-conductive insulating resin sheet extends to the outside close to the molded resin part only at the resin exuding part. Thus, in the heat-conductive insulating resin sheet, the peeling starting point can be prevented from being formed in parallel to the shear stress, so that higher reliability can be obtained in the electric power semiconductor device.

BRIEF DESCRIPTION OF THE DRAWINGS

FIG. 7 is a cross-sectional view showing a variation of the electric power semiconductor devices shown in FIGS. 1, 3 and 4.

FIG. 8 is a cross-sectional view showing a variation of the electric power semiconductor devices shown in FIGS. 5 and 6.

FIG. 11 is a cross-sectional view showing a variation of the electric power semiconductor device shown in FIG. 9.

FIG. 12 is a cross-sectional view showing a variation of the electric power semiconductor device shown in FIG. 10.

FIG. 13 is a cross-sectional view showing an electric power semiconductor device according to an eighth embodiment of the present invention.

EMBODIMENTS OF THE INVENTION

Figure 1:
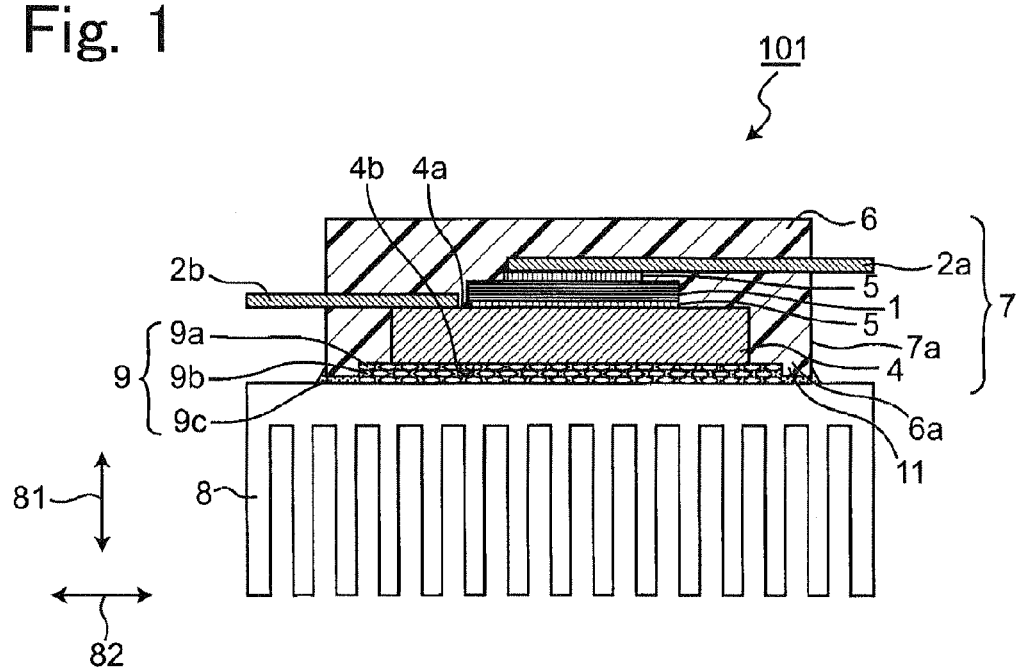
FIG. 1 is a cross-sectional view showing an electric power semiconductor device according to a first embodiment of the present invention.

Hereinafter, electric power semiconductor devices and methods for producing same according to embodiments of the present invention will be described with reference to the drawings. In addition, the same or similar component in the drawings is marked with the same reference symbol.

First Embodiment

FIG. 1 is a cross-sectional view of an electric power semiconductor device 101 according to a first embodiment of the present invention.

The electric power semiconductor device 101 includes a power module 7, a heat dissipating member 8, a heat-conductive insulating resin sheet 9 provided between the power module 7 and the heat dissipating member 8.

The power module 7 has a metal wiring member 4, and a molded resin part 6, as basic components. A lower face of a power semiconductor element 1 and a main terminal 2b are bonded to a mounting face 4a of the metal wiring member 4 with a solder 5 serving as one example of a bonding member. In addition, a main terminal 2a is similarly bonded to an upper face of the power semiconductor element 1 with the solder 5. The metal wiring member 4 is made of copper or aluminum, for example, and the metal wiring member 4 is configured such that a potential is generated during an operation of the power semiconductor element 1. The power semiconductor element 1 corresponds to an IGBT, for example, and the power semiconductor element 1 generates heat during its operation so as to serve as a main heat source in the electric power semiconductor device 101.

The molded resin part 6 is formed by sealing the power semiconductor element 1 and the metal wiring member 4, and the like with a resin under the condition that an opposed face 4b on an opposite side of the mounting face 4a of the metal wiring member 4 is exposed.

In addition, according to the first embodiment, in a back face side of the molded resin part 6 on which the opposed face 4b is exposed, the molded resin part 6 has a protruding part 11 along a whole circumference of a peripheral part 6a of the molded resin part 6. The protruding part 11 has a height slightly smaller than a thickness of the heat-conductive insulating resin sheet 9 which will be described in detail below, and has a rectangular cross section. In addition, the height of the protruding part 11 is a dimension in a thickness direction 81 of the electric power semiconductor device 101, the dimension being taken from the back face of the molded resin part 6 in which the opposed face 4b of the metal wiring member 4 is exposed.

The heat dissipating member 8 serves as a heat sink to externally dissipate the heat generated by the power semiconductor element 1 during its operation, and made of conductive metal such as aluminum or copper. According to this embodiment, fins are provided as shown in the drawing, in order to improve its heat dissipating properties. In addition, cooling may be executed by circulating a heat-conductive solution within the heat dissipating member 8 under the condition that it is connected to a peripheral component such as a radiator. The cooling solution is water, for example.

In addition, since there is a possibility that a potential is generated and a current flows on a metal face of the heat dissipating member 8, the heat dissipating member 8 needs to be electrically insulated from the power module 7.

The heat-conductive insulating resin sheet 9 may be made to contain a thermosetting resin component 9b such as epoxy resin, silicon resin, or polyimide resin. Furthermore, when the resin component 9b is impregnated with a filler 9a in the heat-conductive insulating resin sheet 9, heat conductivity thereof can be considerably improved. As the filler 9a, a material such as aluminum, boron nitride, silicon nitride, or aluminum nitride can be used. In addition, a content rate of the filler 9a in the resin component 9b is preferably about 50% to 80% by volume percent. That is, when it is less than 50%, satisfactory heat conductivity cannot be obtained. Meanwhile, when it is more than 80%, and especially 90% or more, the heat-conductive insulating resin sheet 9 becomes a brittle material, and it is hard to mold. In addition, when the content rate exceeds 80%, there is also another problem that the filler cannot be sufficiently mixed with the resin component and then voids are likely to be left unless an appropriate compounding ratio of a particle size distribution of the filler is selected.

The thickness of the heat-conductive insulating resin sheet 9 is about 100 μm to 500 μm, for example. As described above, the thickness of the heat-conductive insulating resin sheet 9 is slightly larger than the height of the protruding part 11 of the molded resin part 6.

By defining the thickness of the heat-conductive insulating resin sheet 9 as described above, when the electric power semiconductor device 101 is manufactured, the heat-conductive insulating resin sheet 9 extends to an outer wall of the molded resin part 6 while it fills a gap between the protruding part 11 and the heat dissipating member 8, as will be described in detail below. In this way, the heat-conductive insulating resin sheet 9 has a resin exuding part 9c extending to an outside of the molded resin part 6 beyond the peripheral part 6a of the molded resin part 6, that is, to a side face 7a of the power module 7, or to a region beyond the side face 7a.

Figure 2:
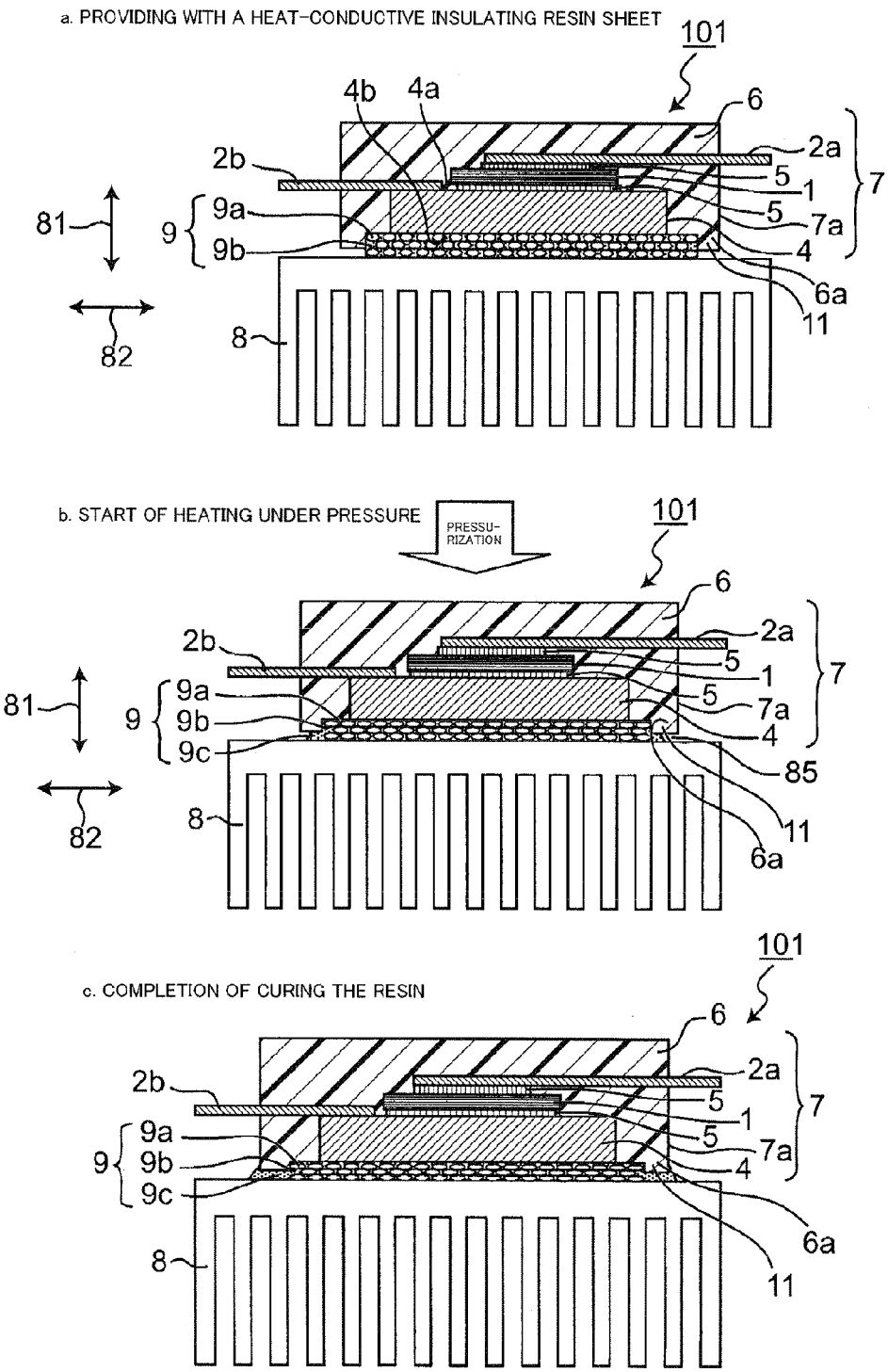
FIG. 2 are views for describing steps for manufacturing the electric power semiconductor device shown in FIG. 1.

Next, a method for manufacturing the electric power semiconductor device 101 configured as described above will be described with reference to FIG. 2.

The heat-conductive insulating resin sheet 9 is provided on a face of the power module 7 or the heat dissipating member 8. By using a vacuum heater pressing device or the like in a reduced-pressure environment, the electric power semiconductor device 101 is heated while pressurized in the thickness direction 81 of the electric power semiconductor device 101 so as to relatively compress the power module 7 and the heat dissipating member 8, whereby the heat-conductive insulating resin sheet 9 is completely cured. The reason why the heater pressing is used is that the heat-conductive insulating resin sheet 9 is heated and then pressurized during a soften period due to the heating, thereby performing the adhesion while crushing the voids in the heat-conductive insulating resin sheet 9. In addition, the reason why the vacuum heater pressing is used is that under a circumstance that the pressure is applied in the reduced-pressure environment, an air layer can be prevented from being sandwiched between the heat-conductive insulating resin sheet 9 and the heat dissipating member 8, and between the heat-conductive insulating resin sheet 9 and the power module 7.

The heat-conductive insulating resin sheet 9 has characteristics in which it is once softened after it becomes half-cured state before it is completely cured while the temperature thereof is raised from a normal temperature to a curing temperature. Therefore, the pressure is applied when it is softened.

At this time, the protruding part 11 of the molded resin part 6 functions as a wall to prevent the heat-conductive insulating resin sheet 9 from expanding in a perpendicular direction 82 perpendicular to the thickness direction 81. As described above, the thickness of the heat-conductive insulating resin sheet 9 is slightly larger than the height of the protruding part 11 and is set so that the protruding part 11 and the heat dissipating member 8 are prevented from being brought into contact with each other even in the case where the heat-conductive insulating resin sheet 9 is entirely crushed and the filler 9a is compressed when the pressure is applied. That is, in order to obtain the heat-conductive insulating resin sheet 9 having the predetermined thickness after cured, the heat-conductive insulating resin sheet 9 needs to be previously pressurized and compressed in the half-cured state so that a compression change rate can be as small as possible with respect to pressure force at the time of complete curing.

By applying a pressure force of the degree of extruding the heat-conductive insulating resin sheet 9 to around the power module 7, namely when the heat-conductive insulating resin sheet 9 has the resin exuding part 9c, a void crushing effect in the heat-conductive insulating resin sheet 9 is produced, so that electric insulating properties can be extremely enhanced.

After the curing of the heat-conductive insulating resin sheet 9 has been completed in this way, the power module 7 and the heat dissipating member 8 are firmly connected with the heat-conductive insulating resin sheet 9, whereby the electric power semiconductor device 101 is completed. The heat conductivity of about 1 W/mK to 20 W/mK, for example, in an insulating sheet has been achieved, and when especially including boron nitride, the insulating sheet with a heat conductivity of 10 W/mK or more is available, so that heat resistance can be decreased. Here, when heat-conductive grease is used for heat transfer between the heat sink and the module incorporating the power semiconductor element, a heat conductivity of the heat-conductive grease is about 4 W/mK. Meanwhile, when the heat-conductive insulating resin sheet 9 is used as described above without using the heat-conductive grease, a heat dissipating path to the heat sink can be formed at low heat resistance, so that heat dissipating performance is enhanced. Thus, even when an area of the power semiconductor element is reduced, a temperature thereof does not reach an operating upper limit temperature, so that the power semiconductor element can be miniaturized. As a result, the semiconductor module and the heat sink can be miniaturized, and thus the electric power semiconductor device is miniaturized.

Next, effects provided by the above electric power semiconductor device 101 will be described.

As described above, since the heat-conductive insulating resin sheet 9 has the resin exuding part 9c, the heat-conductive insulating resin sheet 9 reaches the side face 7a of the power module 7 as shown in the drawing. Thus, according to this embodiment, the heat-conductive insulating resin sheet 9 completely covers an opening 85 (illustration "b" in FIG. 2) corresponding to an extension part of the side face 7a of the power module 7 and provided in a gap between the power module 7 and the heat dissipating member 8, and its outline is a smooth face having no inflection point. Thus, a corner part of the power module 7 and a corner part of an interface of the heat-conductive insulating resin sheet 9 are bonded at almost 90°. Thus, thermal stress concentration caused by steepness in shape change between them can be reduced, and reliability in adhesive interface can be improved.

In other words, the problem to be argued here is a phenomenon that the heat-conductive insulating resin sheet 9 is peeled due to the thermal stress caused by the difference in linear expansion coefficient between the power module 7 and the heat dissipating member 8. The power module 7 and the heat dissipating member 8 are not always made of the same material. In a case where the metal wiring member 4 of the power module 7 is made of copper, a linear expansion rate of the molded resin part 6 is adjusted to that of copper in general to ensure reliability in the solder joint part in the power module 7. Thus, in a case where the power module 7 has almost the same linear expansion rate ($16 \times 10^{-6}/°$ C.) as copper, and the heat dissipating member 8 is made of aluminum ($23 \times 10^{-6}/°$ C.), the heat-conductive insulating resin sheet 9 sandwiched between them needs to absorb a difference in linear expansion rate between them. In the present embodiment, in a state that the end of the heat-conductive insulating resin sheet 9 is positioned at the same level as the end of the power module 7, that is, the side face 7a of the power module 7, or on the inside of the side face 7a in the gap between the protruding part 11 of the molded resin part 6 and the heat dissipating member 8, the thermal stress would be excessively applied.

According to this embodiment, since the heat-conductive insulating resin sheet 9 protrudes outward from the peripheral part 6a of the power module 7, the heat-conductive insulating resin sheet 9 has no inflection point, so that thermal stress applied to the heat-conductive insulating resin sheet 9 can be reduced. According to a thermal stress calculation, in the case, for example, where the end of the heat-conductive insulating resin sheet 9 is on the inside of the side face 7a of the power module 7, that is, in the case where a notch exists, the thermal stress of twice or more is applied, compared with the case where the notch does not exist. In addition, according to a thermal fatigue test performed repetitively at −40° C. to 125° C., the number of cycles until the peeling is generated in the case where the notch does not exist is 4 to 5 times more than that in the case where the notch exists.

Therefore, when the resin component of the heat-conductive insulating resin sheet 9 exudes and covers the outer wall of the power module 7, that is, when the heat-conductive insulating resin sheet 9 has the resin exuding part 9c, the stress concentration generated at the end of the heat-conductive insulating resin sheet 9 can be effectively reduced.

Second Embodiment

Figure 3:
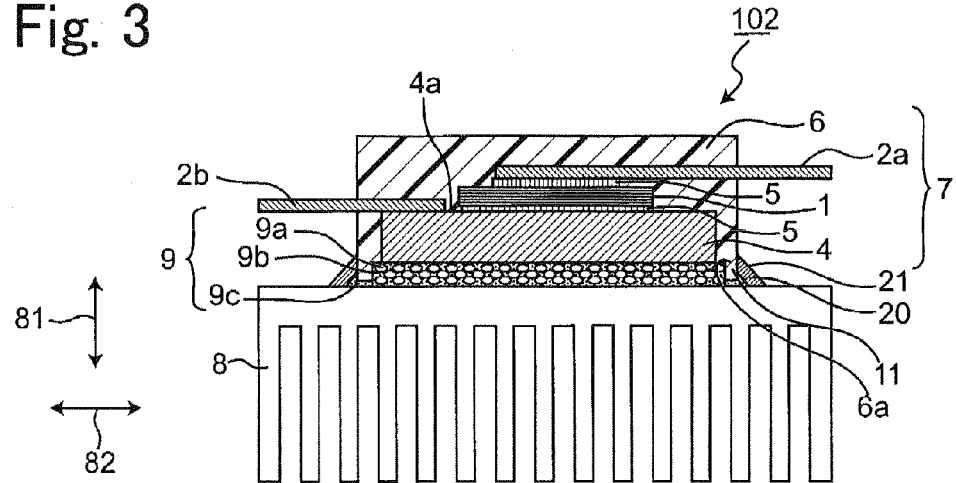
FIG. 3 is a cross-sectional view showing an electric power semiconductor device according to a second embodiment of the present invention.

FIG. 3 is a cross-sectional view of an electric power semiconductor device 102 according to a second embodiment. A basic configuration of the electric power semiconductor device 102 is the same as the configuration of the electric power semiconductor device 101 according to the first embodiment described above, and a detailed description for the same component is omitted here. A difference between the electric power semiconductor device 102 and the electric power semiconductor device 101 is that a resin covering member 20 is further provided.

As shown in FIG. 3, the resin covering member 20 is a member provided from the side face 7a of the power module 7 toward the heat dissipating member 8 so as to cover the above-described resin exuding part 9c, and has a smooth outer face 21 having no inflection point. A material of the resin covering member 20 may be an epoxy resin having adhesive properties and moisture resistance properties, for example.

After the heat-conductive insulating resin sheet 9 has been bonded, the resin covering member 20 is provided around the power module 7 by using a dispenser, for example, and is cured. In order to simplify the manufacturing steps, any ingenuity such that the heat-conductive insulating resin sheet 9 and the resin covering member 20 are cured at the same time may be used.

When the resin covering member 20 is provided, the following advantages can be obtained.

Firstly, a size of the electric power semiconductor device as a whole can be reduced. That is, in a case where the electric power semiconductor device is used for driving a motor of a car, for example, being small in size and light in weight are directly related to fuel consumption serving as basic performance of the car, so that they are important elements. In normal, the plurality of power modules 7 each mounting the two or four power semiconductor elements 1 are aligned and configured for driving a three-phase motor. Thus, it becomes essential to reduce the size and weight of each power module 7 as much as possible. Here, when the resin exuding part 9c is covered with the resin covering member 20, a creepage distance for insulation from the metal wiring member 4 to the heat dissipating member 8 can be gained, which can contribute to the reduction in size and accordingly reduction in weight of the power module 7.

Secondary, adhesive properties and moisture resistance properties with respect to the thermal stress to the heat-conductive insulating resin sheet 9 can be improved. Namely, according to the configuration shown in the first embodiment, in the case where the filler 9a contained in the heat-conductive insulating resin sheet 9 is such as boron nitride, the heat-conductive insulating resin sheet 9 is impregnated with water in a high-temperature and high-moisture environment such as 85° C. and 85%, and the heat-conductive insulating resin sheet 9 could be hydrolyzed. In this case, the initial adhesive strength and electric insulating properties of the heat-conductive insulating resin sheet 9 could not be maintained. In such case, by covering the end of the resin exuding part 9c of the heat-conductive insulating resin sheet 9 with the resin covering member 20, the hydrolysis can be prevented, and a distance between the heat-conductive insulating resin sheet 9 and the environment in high-temperature and high-moisture can be ensured. Thus, the initial adhesive strength and the electric insulating properties can be maintained.

Third Embodiment

Figure 4:
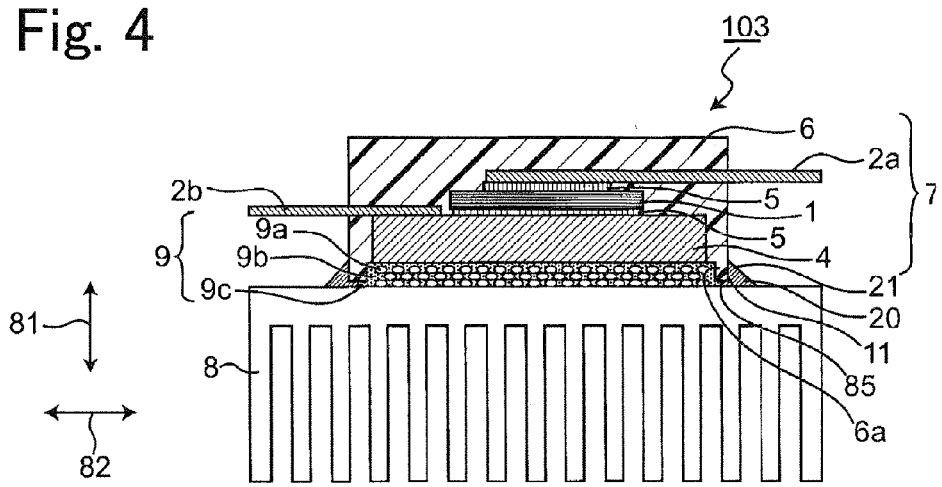
FIG. 4 is a cross-sectional view showing an electric power semiconductor device according to a third embodiment of the present invention.

FIG. 4 is a cross-sectional view of an electric power semiconductor device 103 in a third embodiment. As for the electric power semiconductor device 103, its basic configuration is also the same as the configuration of the electric power semiconductor device 101 in the first embodiment. Therefore, a detailed description for the same component is omitted here too.

A difference between the electric power semiconductor device 103 and the electric power semiconductor device 101 is that as shown in FIG. 4, in the electric power semiconductor device 103, the heat-conductive insulating resin sheet 9 remains within a range of the peripheral part 6a of the molded resin part 6, that is, it does not extend from the peripheral part 6a of the molded resin part 6 to the side face 7a of the power module 7 unlike the electric power semiconductor device 101, and the resin covering member 20 is provided for the heat-conductive insulating resin sheet 9 remaining within the peripheral part 6a of the molded resin part 6.

In addition, a material of the resin covering member 20 and a method for positioning it are the same as the contents described in the second embodiment.

Namely, as shown in FIG. 4, in the case where an exuding region of the heat-conductive insulating resin sheet 9 cannot be reached the outside of the protruding part 11 of the molded resin part 6, the space between the protruding part 11 of the mold resin 6 and the heat dissipating member 8 is filled and bonded with the resin covering member 20, and the resin covering member 20 has an outer face to connect the side face 7a of the power module 7 to the heat dissipating member 8. This configuration can obtain the following advantages.

Firstly, as already described in the second embodiment, the resin covering member 20 is provided, so that in the high-temperature and high-moisture environment, a distance between the heat-conductive insulating resin sheet 9 and the high-temperature and high-moisture environment can be ensured, and thus initial adhesive strength and electric insulating properties can be maintained.

Secondary, as described in the first embodiment as the effect provided when the resin exuding part 9c is provided, the outer shape of the resin covering member 20 is the smooth face having no inflection point, so that thermal stress concentration can be reduced, and reliability of an adhesive interface can be improved.

In other words, when the resin covering member 20 fills the gap between the protruding part 11 and the heat dissipating member 8 and surely bonds them, a notch can be prevented from being formed at the end of the heat-conductive insulating resin sheet 9 where the end becomes the stress concentrated part. Furthermore, the resin covering member 20 completely covers the opening 85 provided at the gap between the power module 7 and the heat dissipating member 8, and its outline is the smooth face 21 having no inflection point. Therefore, the thermal stress concentration caused by the steepness in shape change can be reduced, the steepness in shape change being produced by bonding at roughly 90° the corner part of the power module 7 and the corner part of the interface of the heat-conductive insulating resin sheet 9. As a result, the reliability of the adhesive interface can be improved.

Thirdly, as already described in the second embodiment, the size of the electric power semiconductor device can be reduced as a whole.

According to the first to third embodiments described above, the cross-sectional shape of the protruding part 11 of the molded resin part 6 in the thickness direction 81 is the rectangular shape as shown in FIG. 1 and the like. That is, respective faces of the protruding part 11 intersect with each other at an angle of 90°, in the corner part of the protruding part 11. However, in the cross-sectional shape, the cross-sectional shape of the protruding part 11 is not limited to this, and as shown in FIG. 7, the corner part of the protruding part 11 may have a rounded shape.

Thus, when the corner part of the protruding part 11 is rounded, it is possible to further reduce the thermal stress locally generated around the protruding part 11 and applied to the heat-conductive insulating resin sheet 9, due to the difference in linear expansion coefficient between the heat dissipating member 8 serving as the heat sink and the power module 7.

Fourth Embodiment

Figure 5:
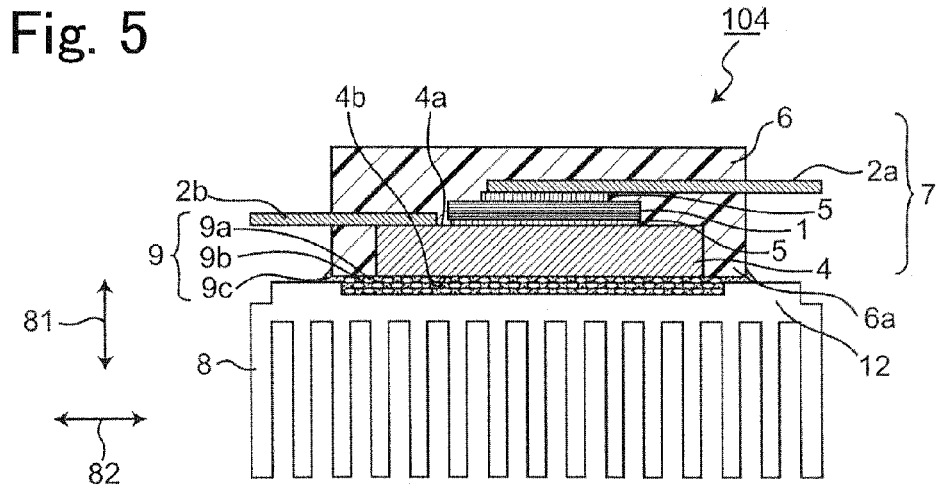
FIG. 5 is a cross-sectional view showing an electric power semiconductor device according to a fourth embodiment of the present invention.

FIG. 5 is a cross-sectional view of an electric power semiconductor device 104 in a fourth embodiment. According to the above first to third embodiments, the protruding part 11 is formed on the molded resin part 6 of the power module 7. Meanwhile, according to the fourth embodiment, a protruding part 12 is formed on the heat dissipating member 8. That is, the heat dissipating member 8 has the protruding part 12 having a height slightly smaller than the thickness of the heat-conductive insulating resin sheet 9 in the thickness direction 81 of the electric power semiconductor device 104, and provided so as to be opposed to the peripheral part 6a of the molded resin part 6. In addition, according to the fourth embodiment, as shown in the drawing, the protruding part 12 of the heat dissipating member 8 is provided so as to range from a part opposed to the peripheral part 6a to a peripheral region of the heat dissipating member 8 in the perpendicular direction 82 perpendicular to the thickness direction 81. In response to the heat dissipating member 8 having this configuration, the molded resin part 6 has a flat back face which is at the same level as the exposed face serving as the opposed face 4b of the metal wiring member 4.

Furthermore, the heat-conductive insulating resin sheet 9 provided so as to be sandwiched between the heat dissipating member 8 having the protruding part 12 and the power module 7 has the resin exuding part 9c extending beyond the peripheral part 6a of the molded resin part 6 toward the outside of the molded resin part 6 in the perpendicular direction 82.

The other configuration in the electric power semiconductor device 104 is the same as that of the electric power semiconductor device 101 in the above first embodiment, so that a detailed description of that is omitted here.

A description will be given of a benefit of the above structure in which the protruding part 12 of the heat dissipating member 8 surrounds an outer circumference of the heat-conductive insulating resin sheet 9 in the electric power semiconductor device 104 in the fourth embodiment.

As described above, the heat-conductive insulating resin sheet 9 has characteristics in which it is once softened in the process of transition from the half-cured state to be completely-cured state while the temperature is raised from the normal temperature to the curing temperature, and the pressure is started at this timing. The heat-conductive insulating resin sheet 9 in the half-cured state hardly has adhesive properties and adhesion properties. In addition, as already described above, in the pressurizing process, the heat-conductive insulating resin sheet 9 may be pressed in the reduced-pressure state. However, in this reduced-pressure state, when an air pressure varies rapidly, an air layer existing between the heat-conductive insulating resin sheet 9 and the heat dissipating member 8 suddenly expands, and thus the positions of the heat-conductive insulating resin sheet 9 and the power module 7 could not be fixed.

As a measure to solve this problem, that is, to prevent the movement, it is considered that the heat-conductive insulating resin sheet 9 in the half-cured state is tentatively bonded to the heat dissipating member 8 at a temperature in which it is not completely cured (80° C. to 120° C., for example). However, in the case where the tentative bonding step is added, additional facilities are needed, and a process time is additionally increased, so that manufacture cost is increased.

Meanwhile, by providing the protruding part 12 on the heat dissipating member 8 so as to surround the outer circumference of the heat-conductive insulating resin sheet 9 as shown in FIG. 5, even when the heat-conductive insulating resin sheet 9 could be moved due to the variation in air pressure under the reduced-pressure environment, the protruding part 12 is in contact with the end of the heat-conductive insulating resin sheet 9 and serves as a wall, so that the positioning of the heat-conductive insulating resin sheet 9 can be surely performed.

In this way, to provide the protruding part 12 of the heat dissipating member 8 is an effective means for achieving the positioning of the heat-conductive insulating resin sheet 9 with minimum number of steps.

Fifth Embodiment

Figure 6:
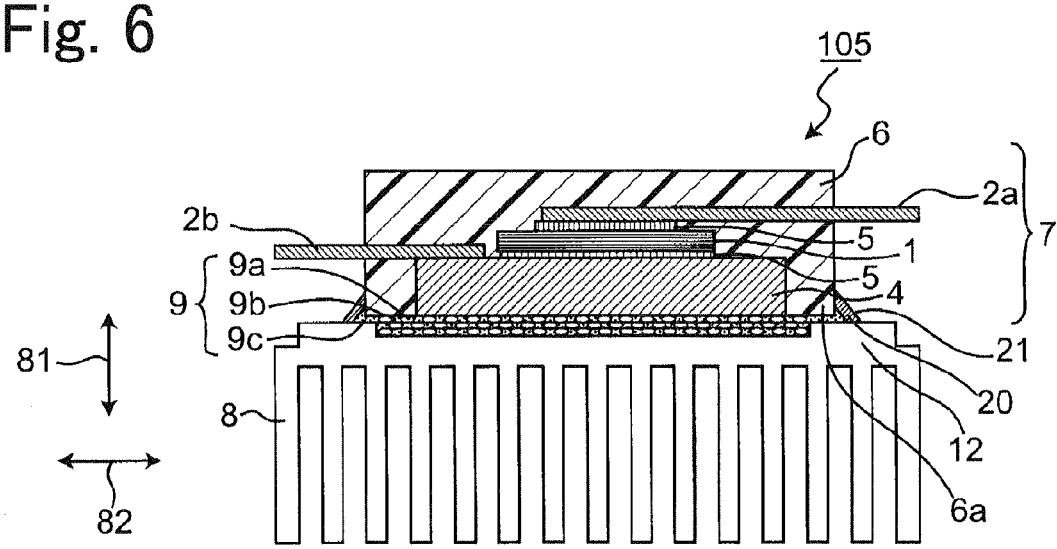
FIG. 6 is a cross-sectional view showing an electric power semiconductor device according to a fifth embodiment of the present invention.

FIG. 6 is a cross-sectional view of an electric power semiconductor device 105 in a fifth embodiment. A basic configuration of the electric power semiconductor device 105 is the same as the configuration of the above electric power semiconductor device 104 in the fourth embodiment. Therefore, a detailed description for the same component is omitted.

Compared with the electric power semiconductor device 104 in the fourth embodiment, the electric power semiconductor device 105 has a configuration in which the resin covering member 20 described in the second embodiment is provided so as to cover the resin exuding part 9c.

By providing this configuration, the interface of the heat-conductive insulating resin sheet 9, that is, the outer face 21 of the resin covering member 20 serves as a smooth face having no inflection point between the side face 7a of the power module 7 corresponding to the side face of the molded resin part 6, and the protruding part 12 of the heat dissipating member 8. Thus, as described in the second embodiment, compared with the case where the corner part of the heat-conductive insulating resin sheet 9 adheres at roughly 90°, for example, and a shape change is steep, the thermal stress concentration applied to the heat-conductive insulating resin sheet 9 can be reduced, and reliability of an adhesive interface can be improved.

According to the above fourth and fifth embodiments, the protruding part 12 formed on the heat dissipating member 8 has a rectangular cross-sectional shape as shown in FIGS. 5 and 6. That is, in the cross-sectional shape of the protruding part 12, respective faces intersect at angle of 90° at the corner part. However, the cross-sectional shape of the protruding part 12 is not limited to this, and as shown in FIG. 8, the corner part of the protruding part 12 may have a rounded shape. In this configuration, similar to the case described with reference to FIG. 7, it is possible to further reduce the thermal stress locally generated around the protruding part 12 and applied to the heat-conductive insulating resin sheet 9, due to the difference in linear expansion coefficient between the power module 7 and the heat dissipating member 8.

Sixth Embodiment

Figure 9:
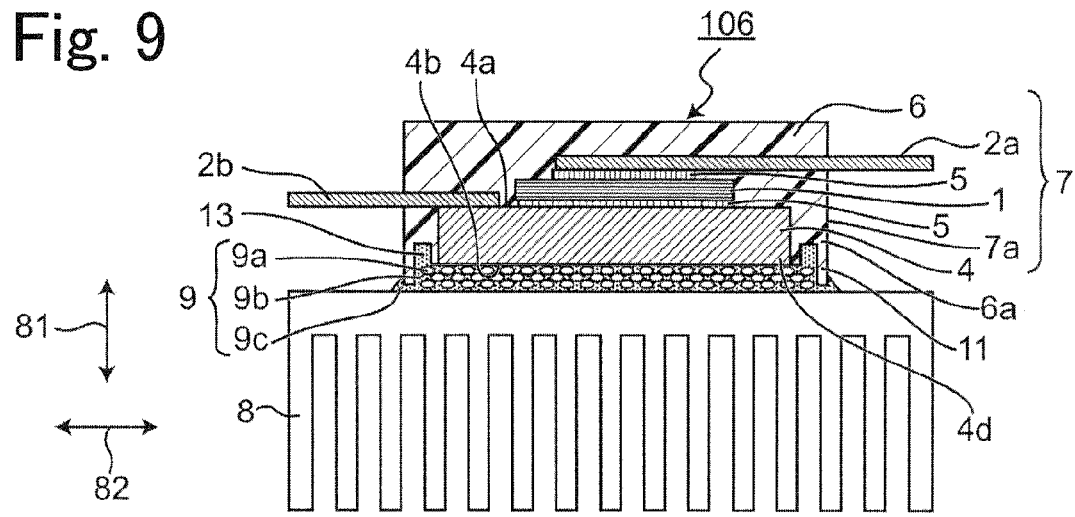
FIG. 9 is a cross-sectional view showing an electric power semiconductor device according to a sixth embodiment of the present invention.

FIG. 9 is a cross-sectional view of an electric power semiconductor device 106 in a sixth embodiment. A basic configuration of the electric power semiconductor device 106 is the same as the above electric power semiconductor device 101 in the first embodiment. Therefore, a detailed description of the same component is omitted.

A description will be given of a difference between the electric power semiconductor device 106 and the electric power semiconductor device 101.

According to the above electric power semiconductor device 101, the protruding part 11 is formed on the molded resin part 6 of the power module 7. Meanwhile, according to the electric power semiconductor device 106 in the sixth embodiment, the power module 7 has the protruding part 11 and a concave portion 13 adjacent to the protruding part 11 in the molded resin part 6. Namely, the power module 7 has the protruding part 11 having the height slightly smaller than the thickness of the heat-conductive insulating resin sheet 9 in the thickness direction 81 of the electric power semiconductor device 106 along the peripheral part 6a of the molded resin part 6, and the concave portion 13 having a depth larger than the thickness of the heat-conductive insulating resin sheet 9 positioned between the protruding part 11 and the metal wiring member 4 in the molded resin part 6.

In addition, the heat-conductive insulating resin sheet 9 provided so as to be sandwiched between the power module 7 having the protruding part 11 and the heat dissipating member 8 has the resin exuding part 9c extending beyond the peripheral part 6a of the molded resin part 6 to the outside of the molded resin part 6 in the perpendicular direction 82.

A description will be given of a benefit of the above concave portion 13, in the electric power semiconductor device 106 in the sixth embodiment.

The description has been given of the fact that the thermal stress to the end of the heat-conductive insulating resin sheet 9 can be reduced when the resin exuding part 9c is provided in the first embodiment. In this regard, it is necessary to increase the thicknesses of the power module 7 and the heat dissipating member 8, and increase sizes of them in a planar direction, upon request to improve output performance of an inverter or the like composed with the electric power semiconductor device. In addition, in order to improve heat dissipating performance, it is necessary to reduce the thickness of the heat-conductive insulating resin sheet 9. When these requests are to be satisfied, the thermal stress to the heat-conductive insulating resin sheet 9 is increased, so that the preferable reliability could not be obtained only with the stress reducing effect by the resin exuding part 9c.

Thus, the concave portion 13 having the depth larger than the thickness of the heat-conductive insulating resin sheet 9 sandwiched between the metal wiring member 4 and the heat dissipating member 8 is provided in the molded resin part 6 on the inside of the protruding part 11 of the power module 7. As a result, in the region which is sandwiched between the metal wiring member 4 and the heat dissipating member 8 and contributes to the heat dissipation, the thickness of the heat-conductive insulating resin sheet 9 can be kept to a requisite minimum, and the thickness of the sheet can be increased only in the end of the heat-conductive insulating resin sheet 9, that is, in the thermal stress concentrated position corresponding to the peripheral part of the sheet. Therefore, the thermal stress to the end of the heat-conductive insulating resin sheet 9 can be further reduced.

As shown in FIG. 9, according to the above electric power semiconductor device 106, the cross-sectional shape of each of the protruding part 11 and the concave portion 13 in the peripheral part 6a of the molded resin part 6 in the thickness direction 81 is a rectangular shape. That is, respective faces intersect with each other at an angle of 90°, in the corner part of each of the protruding part 11 and the concave portion 13 in the cross-sectional shape. However, the cross-sectional shape of each of the protruding part 11 and the concave portion 13 is not limited to this, and as shown in FIG. 11, the corner part of each of the protruding part 11 and concave portion 13 may have a rounded shape.

Thus, when the corner part of each of the protruding part 11 and concave portion 13 is rounded, it is possible to further reduce the thermal stress locally generated around the protruding part 11 and the concave portion 13 and applied to the heat-conductive insulating resin sheet 9, due to the difference in linear expansion coefficient between the power module 7 and the heat dissipating member 8.

In addition, the electric power semiconductor device 106 in the sixth embodiment 6 may have the configuration described in the second embodiment and the third embodiment as a matter of course, and in this case, the effect described in each of them can be further provided.

Seventh Embodiment

Figure 10:
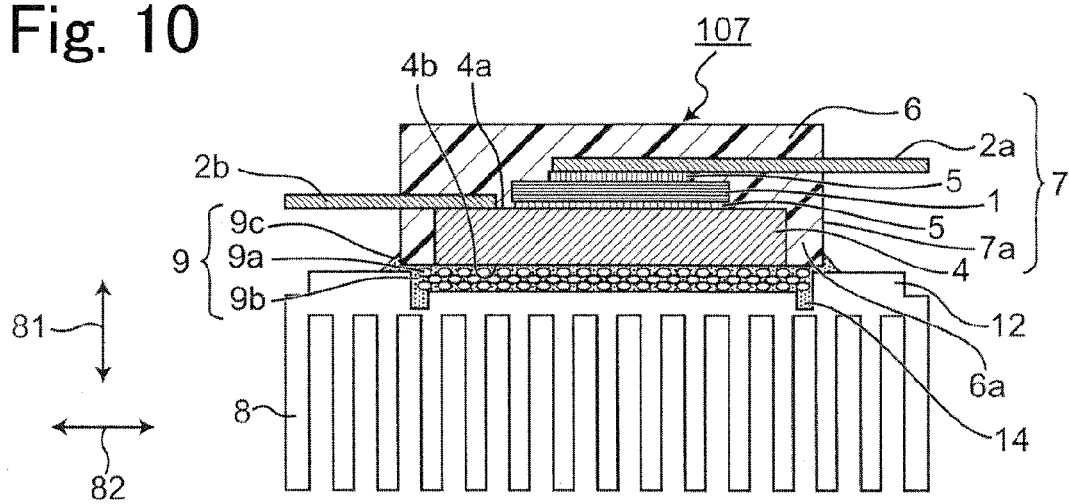
FIG. 10 is a cross-sectional view showing an electric power semiconductor device according to a seventh embodiment of the present invention.

FIG. 10 is a cross-sectional view of an electric power semiconductor device 107 in a seventh embodiment. A basic configuration of the electric power semiconductor device 107 is the same as the configuration of the above electric power semiconductor device 104 in the fourth embodiment. Thus, a detailed description of the same component is omitted.

A description will be given of a difference between the electric power semiconductor device 107 and the electric power semiconductor device 104.

According to the above fourth embodiment, the protruding part 12 is formed on the heat dissipating member 8. Meanwhile, according to the electric power semiconductor device 107 in the seventh embodiment, the protruding part 12 and a concave portion 14 are formed in the heat dissipating member 8.

That is, the heat dissipating member 8 in the electric power semiconductor device 107 has the protruding part 12 having the height slightly smaller than the thickness of the heat-conductive insulating resin sheet 9 in the thickness direction 81 so as to be opposed to the peripheral part 6*a* of the molded resin part 6, and the concave portion 14 formed adjacent to the protruding part 12 on the inside of the protruding part 12 and opposed to the peripheral part 6*a*. The concave portion 14 has a depth larger than the thickness of the heat-conductive insulating resin sheet 9 sandwiched between the metal wiring member 4 and the heat dissipating member 8.

According to the seventh embodiment, as shown in the drawing, the protruding part 12 on the heat dissipating member 8 is provided in a range from the part opposed to the peripheral part 6*a* to a peripheral region of the heat dissipating member 8 in the perpendicular direction 82, that is, beyond the side face 7*a* of the power module 7 to the outside of the molded resin part 6. Further, in the state that the heat dissipating member 8 has this configuration, the molded resin part 6 has a flat back face which is the same level as an exposed face serving as the opposed face 4*b* of the metal wiring member 4.

Furthermore, the heat-conductive insulating resin sheet 9 provided so as to be sandwiched between the heat dissipating member 8 having the protruding part 12, and the power module 7 has the resin exuding part 9*c* extending beyond the peripheral part 6*a* of the molded resin part 6 to the outside of the molded resin part 6 in the perpendicular direction 82.

A description will be given of a benefit of the above concave portion 14 in the electric power semiconductor device 107 in the seventh embodiment.

In the first embodiment, the description has been given of the fact that the thermal stress to the end of the heat-conductive insulating resin sheet 9 can be reduced when the resin exuding part 9*c* is provided. Meanwhile, as described in the sixth embodiment, in the case where the requests to improve the output performance of the inverter composed with the electric power semiconductor device, and to improve the heat dissipating performance are to be satisfied, the preferable reliability could not be obtained only with the stress reducing effect by the resin exuding part 9*c*.

Thus, in the heat dissipating member 8, the concave portion 14 is provided on the inside of the protruding part 12, and has the depth larger than the thickness of the heat-conductive insulating resin sheet 9 sandwiched between the metal wiring member 4 and the heat dissipating member 8. As a result, in a region sandwiched between the metal wiring member 4 and the heat dissipating member 8 and contributing to the heat dissipation, the thickness of the heat-conductive insulating resin sheet 9 can be kept to the requisite minimum and can be increased only in the end of the heat-conductive insulating resin sheet 9, that is, in the thermal stress concentrated position corresponding to the peripheral part of the sheet. Therefore, the thermal stress to the end of the heat-conductive insulating resin sheet 9 can be further reduced.

As shown in FIG. 10, according to the above electric power semiconductor device 107, the cross-sectional shape of each of the protruding part 12 and the concave portion 14 in the heat dissipating member 8 in the thickness direction 81 is a rectangular shape. That is, respective faces intersect with each other at an angle of 90°, in the corner part of each of the protruding part 12 and the concave portion 14 in the cross-sectional shape. However, the cross-sectional shape of each of the protruding part 12 and the concave portion 14 is not limited to this, and as shown in FIG. 12, the corner part of each of the protruding part 12 and concave portion 14 may have a rounded shape.

Thus, when the corner part of each of the protruding part 12 and concave portion 14 is rounded, it is possible to further reduce the thermal stress locally generated around the protruding part 12 and the concave portion 14 and applied to the heat-conductive insulating resin sheet 9, due to the difference in linear expansion coefficient between the power module 7 and the heat dissipating member 8.

In addition, the electric power semiconductor device 107 may have the configuration having the resin covering member 20 described in the fifth embodiment as a matter of course, and in this case, the described effect can be further provided.

Eighth Embodiment

FIG. 13 is a cross-sectional view of an electric power semiconductor device 108 in an eighth embodiment. A basic configuration of the electric power semiconductor device 108 is the same as the configuration of the above electric power semiconductor device 106 in the sixth embodiment shown in FIG. 9. Thus, a detailed description of the same component is omitted.

A description will be given of a difference between the electric power semiconductor device 108 and the electric power semiconductor device 106.

According to the above electric power semiconductor device 106 in the sixth embodiment, the protruding part 11 and the concave portion 13 are formed in the molded resin part 6 of the power module 7. Here, as shown in FIG. 9, the concave portion 13 is formed between the protruding part 11 and the metal wiring member 4 in the perpendicular direction 82, and the wall of the molded resin part 6 exists between the concave portion 13 and the metal wiring member 4.

Meanwhile, according to the electric power semiconductor device 108 in the eighth embodiment, the power module 7 has a concave portion 15 formed integrally with the molded resin part 6 and a corner part 4*d* (FIGS. 9 and 11) of the metal wiring member 4. More specifically, the molded resin part 6 of the power module 7 has the protruding part 11 and a resin-part-side concave portion 15*a* shown in FIG. 13. As described above, the wall of the molded resin part 6 exists between the concave portion 13 and the metal wiring member 4. On the other hand, according to the eighth embodiment, the wall of the molded resin part 6 does not exist, and the resin-part-side concave portion 15*a* is formed from the protruding part 11 to the end face 4*c* of the metal wiring member 4 in the perpendicular direction 82. In addition, according to the eighth embodiment, as shown in FIG. 13, the metal wiring member 4 has a metal-wiring-member-side concave portion 15*b* formed in a part which is in contact with the resin-part-side concave portion 15*a* and corresponds to the corner part 4*d* of the metal wiring member. The resin-part-side concave portion 15*a* and the metal-wiring-member-side concave portion 15*b* form the concave portion 15 as a whole. The concave portion 15 has a depth larger than the thickness of the heat-conductive insulating resin sheet 9 sandwiched between a center part of the metal wiring member 4 and the heat dissipating member 8.

In addition, the heat-conductive insulating resin sheet 9 provided so as to be sandwiched between the power module 7 having the protruding part 11, and the heat dissipating member 8 has the resin exuding part 9c extending beyond the peripheral part 6a of the molded resin part 6 to the outside of the molded resin part 6 in the perpendicular direction 82.

Thus, the following effect can be obtained because the concave portion 15 is formed adjacent to the protruding part 11 and extends from the molded resin part 6 to the metal wiring member 4 in the perpendicular direction 82.

Namely, in the range sandwiched between the metal wiring member 4 and the heat dissipating member 8 which contribute to the heat dissipation, the thickness of the heat-conductive insulating resin sheet 9 is kept to a requisite minimum, and can be increased in only the concave portion 15 corresponding to one section in which the metal wiring member 4, the molded resin part 6, and the heat-conductive insulating resin sheet 9 are intersected with each other. Therefore, it becomes possible to further reduce the thermal stress of the heat-conductive insulating resin sheet 9 in the one section in which the metal wiring member 4, the molded resin part 6, and the heat-conductive insulating resin sheet 9 are intersected with each other.

In addition, a configuration may be provided by appropriately combining the above-described embodiments. In this configuration, the effects of the combined embodiments can be provided.

An electric power semiconductor device in a first aspect of the present invention includes a power module and a heat dissipating member connected to the power module, wherein the power module has a metal wiring member mounting a power semiconductor element on a mounting face, and a molded resin part sealing the power semiconductor element and the metal wiring member in a state that an opposed face opposite to the mounting face is exposed in the metal wiring member, and the heat dissipating member is arranged on the opposed face with a heat-conductive insulating resin sheet provided between them, in which one of the molded resin part and the heat dissipating member has a protruding part configured to have a height slightly smaller than a thickness of the heat-conductive insulating resin sheet in a thickness direction of the electric power semiconductor device, the protruding part in the molded resin part is formed in its peripheral part, and the protruding part in the heat dissipating member is formed to be opposed to the peripheral part of the molded resin part; and the heat-conductive insulating resin sheet has a resin exuding part configured to extend beyond the peripheral part of the molded resin part to an outside of the molded resin part in a direction perpendicular to the thickness direction.

In addition, an electric power semiconductor device in a second aspect of the present invention includes a power module and a heat dissipating member connected to the power module, wherein the power module has a metal wiring member mounting a power semiconductor element on a mounting face, and a molded resin part sealing the power semiconductor element and the metal wiring member in a state that an opposed face opposite to the mounting face is exposed in the metal wiring member; and the heat dissipating member is arranged on the opposed face with a heat-conductive insulating resin sheet provided between them, in which the molded resin part has a protruding part configured to have a height slightly smaller than a thickness of the heat-conductive insulating resin sheet in its peripheral part in a thickness direction of the electric power semiconductor device; and the heat-conductive insulating resin sheet has a resin exuding part configured to extend beyond the peripheral part of the molded resin part to an outside of the molded resin part in a direction perpendicular to the thickness direction.

The electric power semiconductor device in a third aspect of the present invention may further include a resin covering member configured to cover the resin exuding part and have a smooth outer face with no inflection point in the first aspect and the second aspect.

In addition, an electric power semiconductor device in a fourth aspect of the present invention includes a power module and a heat dissipating member connected to the power module, wherein the power module has a metal wiring member mounting a power semiconductor element on a mounting face, and a molded resin part sealing the power semiconductor element and the metal wiring member in a state that an opposed face opposite to the mounting face is exposed in the metal wiring member; and the heat dissipating member is arranged on the opposed face with a heat-conductive insulating resin sheet provided between them, in which the molded resin part has a protruding part configured to have a height slightly smaller than a thickness of the heat-conductive insulating resin sheet in its peripheral part in a thickness direction of the electric power semiconductor device; the heat-conductive insulating resin sheet extends in a direction perpendicular to the thickness direction within a range of the peripheral part of the molded resin part; and the electric power semiconductor device further includes a resin covering member configured to cover the heat-conductive insulating resin sheet provided within the range of the peripheral part of the molded resin part, extend to an outside of the molded resin part, and have a smooth outer face with no inflection point.

In addition, an electric power semiconductor device in a fifth aspect of the present invention includes a power module and a heat dissipating member connected to the power module, wherein the power module has a metal wiring member mounting a power semiconductor element on a mounting face, and a molded resin part sealing the power semiconductor element and the metal wiring member in a state that an opposed face opposite to the mounting face is exposed in the metal wiring member; and the heat dissipating member is arranged on the opposed face with a heat-conductive insulating resin sheet provided between them, in which the heat dissipating member has a protruding part configured to have a height slightly smaller than a thickness of the heat-conductive insulating resin sheet in a thickness direction of the electric power semiconductor device, and be formed to be opposed to a peripheral part of the molded resin part; and the heat-conductive insulating resin sheet has a resin exuding part configured to extend beyond the peripheral part of the molded resin part to an outside of the molded resin part in a direction perpendicular to the thickness direction.

In addition, the electric power semiconductor device in a sixth aspect of the present invention may further include a resin covering member configured to cover the resin exuding part and have a smooth outer face with no inflection point in the fifth aspect.

In addition, in the electric power semiconductor device of a seventh aspect of the present invention, the protruding part may have a rounded corner part in any one of the first to fifth aspects.

In addition, an electric power semiconductor device in an eighth aspect of the present invention includes a power module and a heat dissipating member connected to the power module, wherein the power module has a metal wiring member mounting a power semiconductor element on a mounting face, and a molded resin part sealing the power semiconductor element and the metal wiring member in a state that an opposed face opposite to the mounting face is exposed in the metal wiring member; and the heat dissipating member is arranged on the opposed face with a heat-conductive insulating resin sheet provided between them, in which the molded resin part has a protruding part, in a peripheral part of the molded resin part, configured to have a height slightly smaller than a thickness of the heat-conductive insulating resin sheet sandwiched between the metal wiring member and the heat dissipating member in a thickness direction of the electric power semiconductor device, and a concave portion, on an inside of the protruding part, configured to have a depth larger than the thickness of the heat-conductive insulating resin sheet sandwiched between the metal wiring member and the heat dissipating member; and the heat-conductive insulating resin sheet has a resin exuding part configured to extend beyond the peripheral part of the molded resin part to an outside of the molded resin part in a direction perpendicular to the thickness direction.

In addition, an electric power semiconductor device in a ninth aspect of the present invention includes a power module and a heat dissipating member connected to the power module, wherein the power module has a metal wiring member mounting a power semiconductor element on a mounting face, and a molded resin part sealing the power semiconductor element and the metal wiring member in a state that an opposed face opposite to the mounting face is exposed in the metal wiring member; and the heat dissipating member is arranged on the opposed face with a heat-conductive insulating resin sheet provided between them, in which the heat dissipating member has a protruding part, in a peripheral part of the heat dissipating member, configured to have a height slightly smaller than a thickness of the heat-conductive insulating resin sheet sandwiched between the metal wiring member and the heat dissipating member in a thickness direction of the electric power semiconductor device, and a concave portion, on an inside of the protruding part of the heat dissipating member, configured to have a depth larger than the thickness of the heat-conductive insulating resin sheet sandwiched between the metal wiring member and the heat dissipating member; and the heat-conductive insulating resin sheet has a resin exuding part configured to extend beyond the peripheral part of the molded resin part to an outside of the molded resin part in a direction perpendicular to the thickness direction.

In addition, an electric power semiconductor device in a tenth aspect of the present invention includes a power module and a heat dissipating member connected to the power module, wherein the power module has a metal wiring member mounting a power semiconductor element on a mounting face, and a molded resin part sealing the power semiconductor element and the metal wiring member in a state that an opposed face opposite to the mounting face is exposed in the metal wiring member; and the heat dissipating member is arranged on the opposed face with a heat-conductive insulating resin sheet provided between them, in which the molded resin part has a protruding part, in a peripheral part of the molded resin part, configured to have a height slightly smaller than a thickness of the heat-conductive insulating resin sheet sandwiched between the metal wiring member and the heat dissipating member in a thickness direction of the electric power semiconductor device, and a resin-part-side concave portion configured to extend from the protruding part to an end face of the metal wiring member in a direction perpendicular to the thickness direction, the resin-part-side concave portion has a depth larger than the thickness of the heat-conductive insulating resin sheet sandwiched between the metal wiring member and the heat dissipating member; the metal wiring member has a metal-wiring-member-side concave portion positioned in a corner part of the metal wiring member abutting on the resin-part-side concave portion, and the metal-wiring-member-side concave portion has a depth larger than the thickness of the heat-conductive insulating resin sheet sandwiched between the metal wiring member and the heat dissipating member and is integrally formed with the resin-part-side concave portion; and the heat-conductive insulating resin sheet has a resin exuding part configured to extend beyond the peripheral part of the molded resin part to an outside of the molded resin part in the direction perpendicular to the thickness direction.

In addition, according to the electric power semiconductor device in an eleventh aspect of the present invention, the protruding part and the concave portion may have a rounded corner part in any one of the eighth to tenth aspects.

In addition, according to a method for manufacturing an electric power semiconductor device in a twelfth aspect of the present invention, the electric power semiconductor device includes a power module and a heat dissipating member connected to the power module, wherein the power module has a metal wiring member mounting a power semiconductor element on a mounting face, and a molded resin part sealing the power semiconductor element and the metal wiring member in a state that an opposed face opposite to the mounting face is exposed in the metal wiring member; the heat dissipating member is arranged on the opposed face with a heat-conductive insulating resin sheet provided between them; and the molded resin part has a protruding part having a height slightly smaller than a thickness of the heat-conductive insulating resin sheet in a peripheral part of the molded resin part in a thickness direction of the electric power semiconductor device, the method for manufacturing the electric power semiconductor device including:

arranging the heat-conductive insulating resin sheet between the opposed face and the heat dissipating member;

heating the heat-conductive insulating resin sheet in a reduced-pressure environment;

applying a pressure in the thickness direction when the heat-conductive insulating resin sheet is softened from a half-cured state;

forming a resin exuding part by extending the heat-conductive insulating resin sheet beyond the peripheral part of the molded resin part to an outside of the molded resin part, with the above pressure, in a direction perpendicular to the thickness direction; and curing the heat-conductive insulating resin sheet by additional heating to connect the power module and the heat dissipating member.

The present invention has been fully described in connection with the preferable embodiments with reference to the accompanying drawings, but various variations and modifications are obvious for a person skilled in the art. It is to be understood that as long as the variations and modifications do not depart from the scope of the present invention provided by the appended claims, they are included therein.

In addition, all disclosed contents of specification, drawings, claims, and abstract in Japanese Patent Application No. 2011-283800 filed on Dec. 26, 2011 are incorporated into this Description by reference.

DESCRIPTION OF REFERENCE SYMBOLS

1 ELECTRIC POWER SEMICONDUCTOR DEVICE
4 METAL WIRING MEMBER
6 MOLDED RESIN PART
7 POWER MODULE
8 HEAT DISSIPATING MEMBER
9 HEAT-CONDUCTIVE INSULATING RESIN SHEET
9c RESIN EXUDING PART
11 PROTRUDING PART
12 PROTRUDING PART
20 RESIN COVERING MEMBER
13 CONCAVE PORTION
14 CONCAVE PORTION
15 CONCAVE PORTION
101-108 ELECTRIC POWER SEMICONDUCTOR DEVICE

The invention claimed is:

1. An electric power semiconductor device comprising a power module and a heat dissipating member connected to the power module, wherein, the power module has a metal wiring member mounting a power semiconductor element on a mounting face, and a molded resin part sealing the power semiconductor element and the metal wiring member in a state that an opposed face opposite to the mounting face is exposed in the metal wiring member; and the heat dissipating member is arranged on the opposed face with a heat-conductive insulating resin sheet provided therebetween, in which,
 one of the molded resin part and the heat dissipating member has a protruding part configured to have a height slightly smaller than a thickness of the heat-conductive insulating resin sheet in a thickness direction of the electric power semiconductor device, the protruding part in the molded resin part is formed in a peripheral part of the molded resin part, and the protruding part in the heat dissipating member is formed to be opposed to the peripheral part of the molded resin part;
 the heat-conductive insulating resin sheet has a resin exuding part configured to extend beyond the peripheral part of the molded resin part to an outside of the molded resin part in a direction perpendicular to the thickness direction; and
 the electric power semiconductor device further comprising a resin covering member configured to cover the resin exuding part and have a smooth outer face with no inflection point.

2. The electric power semiconductor device according to claim 1, wherein the protruding part has a rounded corner part.

3. An electric power semiconductor device comprising a power module and a heat dissipating member connected to the power module, wherein, the power module has a metal wiring member mounting a power semiconductor element on a mounting face, and a molded resin part sealing the power semiconductor element and the metal wiring member in a state that an opposed face opposite to the mounting face is exposed in the metal wiring member; and the heat dissipating member is arranged on the opposed face with a heat-conductive insulating resin sheet provided therebetween, in which,
 the molded resin part has a protruding part, in a peripheral part of the molded resin part, configured to have a height slightly smaller than a thickness of the heat-conductive insulating resin sheet sandwiched between the metal wiring member and the heat dissipating member in a thickness direction of the electric power semiconductor device, and a resin-part-side concave portion configured to extend from the protruding part to an end face of the metal wiring member in a direction perpendicular to the thickness direction, the resin-part-side concave portion has a depth larger than the thickness of the heat-conductive insulating resin sheet sandwiched between the metal wiring member and the heat dissipating member;
 the metal wiring member has a metal-wiring-member-side concave portion positioned in a corner part of the metal wiring member abutting on the resin-part-side concave portion, and the metal-wiring-member-side concave portion has a depth larger than the thickness of the heat-conductive insulating resin sheet sandwiched between the metal wiring member and the heat dissipating member and is integrally formed with the resin-part-side concave portion; and
 the heat-conductive insulating resin sheet has a resin exuding part configured to extend beyond the peripheral part of the molded resin part to an outside of the molded resin part in the direction perpendicular to the thickness direction.

4. The electric power semiconductor device according to claim 3, wherein the protruding part has a rounded corner part.

5. A method for manufacturing an electric power semiconductor device, wherein,
 the electric power semiconductor device includes a power module and a heat dissipating member connected to the power module, the power module has a metal wiring member mounting a power semiconductor element on a mounting face, and a molded resin part sealing the power semiconductor element and the metal wiring member in a state that an opposed face opposite to the mounting face is exposed in the metal wiring member; the heat dissipating member is arranged on the opposed face with a heat-conductive insulating resin sheet provided therebetween; and the molded resin part has a protruding part, in a peripheral part of the molded resin part, having a height slightly smaller than a thickness of the heat-conductive insulating resin sheet in a thickness direction of the electric power semiconductor device,
 the method for manufacturing the electric power semiconductor device comprising:
 arranging the heat-conductive insulating resin sheet between the opposed face and the heat dissipating member;
 heating the heat-conductive insulating resin sheet in a reduced-pressure environment, and applying a pressure to the heat-conductive insulating resin in the thickness direction when the heat-conductive insulating resin sheet is softened from a half-cured state;
 forming a resin exuding part by extending the heat-conductive insulating resin sheet beyond the peripheral part of the molded resin part to an outside of the molded resin part, with the pressure, in a direction perpendicular to the thickness direction; and
 curing the heat-conductive insulating resin sheet by additional heating to connect the power module and the heat dissipating member.

* * * * *